(12) United States Patent
Jeon (10) Patent No.: US 8,258,838 B2
(45) Date of Patent: Sep. 4, 2012

(54) DELAY LOCKED LOOP FOR EXPANDING A DELAY RANGE

(75) Inventor: Seon-Kwang Jeon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 86 days.

(21) Appl. No.: 12/880,625

(22) Filed: Sep. 13, 2010

(65) Prior Publication Data

US 2012/0008726 A1  Jan. 12, 2012

(30) Foreign Application Priority Data

Jul. 8, 2010  (KR) .......................... 10-2010-0065959

(51) Int. Cl.
*H03L 7/06* (2006.01)

(52) U.S. Cl. .................. 327/158; 327/156; 375/376

(58) Field of Classification Search ................. 327/156, 327/158; 375/376

See application file for complete search history.

(56) References Cited

U.S. PATENT DOCUMENTS

2009/0167388 A1*  7/2009  Lee ............................. 327/158

* cited by examiner

*Primary Examiner* — John Poos (74) *Attorney, Agent, or Firm* — IP & T Group LLP (57) ABSTRACT

A delay locked loop includes a delay amount setting unit configured to set a delay amount of an external clock signal, a coarse delay unit configured to primarily delay the external clock signal by the set delay amount based on a first unit duration which is a unit delay amount of the coarse delay unit; and a fine delay unit configured to secondarily finely delay the primarily delayed clock signal based on a second unit duration, which is a unit delay amount of the fine delay unit and smaller than the first unit duration.

20 Claims, 7 Drawing Sheets

DELAY LOCKED LOOP FOR EXPANDING A DELAY RANGE

CROSS-REFERENCE TO RELATED APPLICATIONS

The present application claims priority of Korean Patent Application No. 10-2010-0065959, filed on Jul. 8, 2010, which is incorporated herein by reference in its entirety.

BACKGROUND OF THE INVENTION

Exemplary embodiments of the present invention relate to a delay locked loop (DLL) used in a semiconductor integrated circuit.

A semiconductor integrated circuit such as various logic operation devices, CPUs, and memory devices includes a logic circuit which processes data. In order to normally process data, a logic circuit of a semiconductor integrated circuit may operate in synchronization with a reference signal outputted from an oscillator. Here, a semiconductor integrated circuit may include a delay locked loop which synchronizes a clock signal outputted from an oscillator with an operation clock of a logic circuit.

A typical delay locked loop includes a delay line having a plurality of unit delay cells coupled in series. The delay line becomes longer as the delay range of the delay locked loop increases. In other words, the number of unit delay cells coupled in series increases linearly in proportion to expansion of the delay range (that is, delay amount) of the delay locked loop.

In addition, the delay locked loop may include a selection circuit which selects any one of signals delayed by the delay line. The selection circuit has as many input passages as the expansion of the delay range. In other words, as the delay range expands, the selection circuit becomes complicated.

Therefore, the delay locked loop may have difficulty in expanding the delay range and have a complicated circuit configuration in proportion to the magnitude of the delay range. Furthermore, the delay locked loop may occupy a larger area as the delay range expands, causing difficulty in a circuit layout of a semiconductor integrated circuit.

SUMMARY OF THE INVENTION

An exemplary embodiment of the present invention is directed to a delay locked loop which facilitates the expansion of a delay range.

Another exemplary embodiment of the present invention is directed to a delay locked loop which is capable of expanding a delay range without addition of elements to a circuit configuration.

In accordance with an exemplary embodiment of the present invention, a delay locked loop includes a delay amount setting unit configured to set a delay amount of an external clock signal, a coarse delay unit configured to primarily delay the external clock signal by the set delay amount based on a first unit duration which is a unit delay amount of the coarse delay unit; and a fine delay unit configured to secondarily finely delay the primarily delayed clock signal based on a second unit duration, which is a unit delay amount of the fine delay unit and smaller than the first unit duration.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
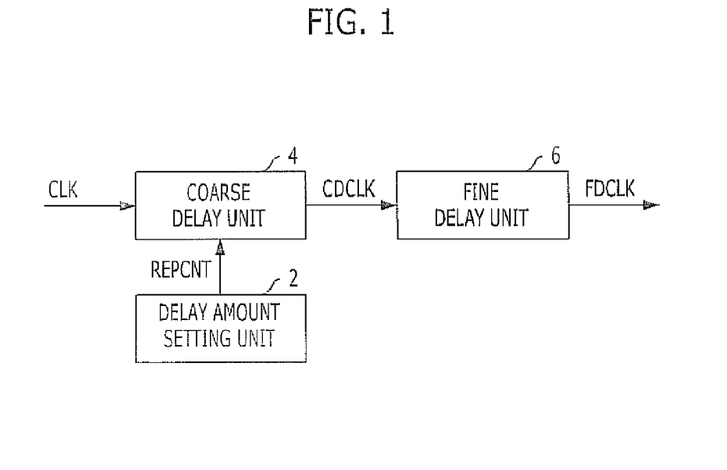
FIG. 1 is a schematic block diagram illustrating a delay locked loop in accordance with an exemplary embodiment of the present invention.

FIG. 1 is a schematic block diagram illustrating a delay locked loop in accordance with an exemplary embodiment of the present invention.

Referring to FIG. 1, the delay locked loop in accordance with the exemplary embodiment of the present invention includes a delay amount setting unit 2, a coarse delay unit 4, and a fine delay unit 6. The delay amount setting unit 2, the coarse delay unit 4, and the fine delay unit 6 are arranged inside a semiconductor integrated circuit. The semiconductor integrated circuit may be one of various logic operation devices, CPUs, and memory devices. Also, the semiconductor integrated circuit may include a logic circuit unit (not shown) which processes data. The logic circuit unit may operate in synchronization with a delayed clock signal supplied from the fine delay 6. A clock signal CLK supplied to the coarse delay unit 4 is generated from a clock oscillator (not shown) arranged outside the semiconductor integrated circuit. The external clock signal CLK may include a non-inverted clock signal CLKT and an inverted clock signal CLKB.

The delay amount setting unit 2 sets a delay amount to include a total delay amount (that is, a target delay amount) of the clock signal, and the total delay amount include a delay amount of the coarse delay unit 4 and the fine delay unit 6. A reference delay amount set by the delay amount setting unit 2 may be set to a duration (or time) unit (hereinafter, referred to as a "coarse unit duration" or a "coarse duration unit") corresponding to 1/2n of one cycle (T) of the external clock signal CLK. Here, "n" is a natural number of at least 10, but it will be described in this exemplary embodiment on the assumption that "n" is set to 37. In this case, the reference delay amount is greater than the target delay amount (that is, the sum of the coarse delay amount by the coarse delay unit 4 and the fine delay amount by the fine delay unit 6), and less than "the target delay amount+the coarse unit duration (T/2n)". Furthermore, the reference delay amount may be set to the coarse unit duration (T/2n) within the half cycle (T/2) range of the external clock signal CLK.

Alternatively, the delay amount setting unit 2 may set a replica delay amount instead of the reference delay amount. The replica delay amount may include a target delay recovery amount corresponding to "the cycle of the external clock signal—the target delay amount". The replica delay amount may be set to a value corresponding to "the cycle (T) of the external clock signal—the target delay amount+the coarse unit duration (T/2n)". In other words, the replica delay amount may be larger than the target delay recovery amount and less than "the target delay recovery amount+the coarse unit duration (T/2n)". Furthermore, like the reference delay amount, the replica delay amount may be set to the coarse unit duration (T/2n) within the half cycle (T/2) range of the external clock signal CLK.

The coarse delay unit 4 delays the external clock signal CLK by the coarse delay amount by using a method of adjusting the delay amount to the coarse unit duration (T/2n), based on the "reference delay amount" or the replica delay amount set by the delay amount setting unit 2. A primarily delayed clock signal CDCLK delayed by the coarse delay unit 4 is supplied to the fine delay unit 6. Here, the coarse delay unit 4 may delay the external clock signal CLK by the coarse delay amount of the coarse duration unit (that is, the reference delay amount−T/2n) or "the half cycle (T/2) of the external clock signal+the coarse delay amount". The coarse delay unit 4 may be configured differently according to which one of the reference delay amount and the replica delay amount is outputted from the delay amount setting unit 2. Also, the internal connection configuration of the coarse delay unit 4 may be modified according to whether the external clock signal CLK is delayed by less than or greater than the half cycle (T/2) of the external clock signal. The primarily delayed clock signal CDCLK outputted from the coarse delay unit 4 includes a non-inverted coarse delay clock signal CDCLKT and an inverted coarse delay clock signal CDCLKB.

The fine delay unit 6 secondarily finely delays the primarily delayed clock signal CDCLK, which is primarily delayed by the coarse delay unit 4, within the range of the coarse unit duration (that is, T/2n of the external clock signal CLK). A secondary delayed clock signal FDCLK finely delayed by the fine delay unit 6 is supplied to a logic circuit unit (not shown) as an internal clock signal. Here, the fine delay unit 6 may include unit delay cells coupled in series. Each of the unit delay cells, according to an example, delays the primarily delayed clock signal during a "fine duration unit" or a "fine unit duration" corresponding to 1/m of the coarse duration unit. "m" is a natural number of at least 3. The fine delay unit 6 may have the same circuit configuration as a delay locked loop well known to those skilled in the art. Therefore, the description about the detailed circuit configuration of the fine delay unit will be omitted.

As described above, the delay locked loop in accordance with the exemplary embodiment of the present invention may greatly change the delay range of the external clock signal by changing, for example, only the reference delay amount or the replica delay amount. Therefore, the delay locked loop may easily expand the delay amount of the external clock signal without addition of circuit elements. Furthermore, the semiconductor integrated circuit including the delay locked loop may also easily achieve the synchronization between the external clock signal and the operation clock of the logic circuit unit, even though a phase difference is large.

Figure 2:
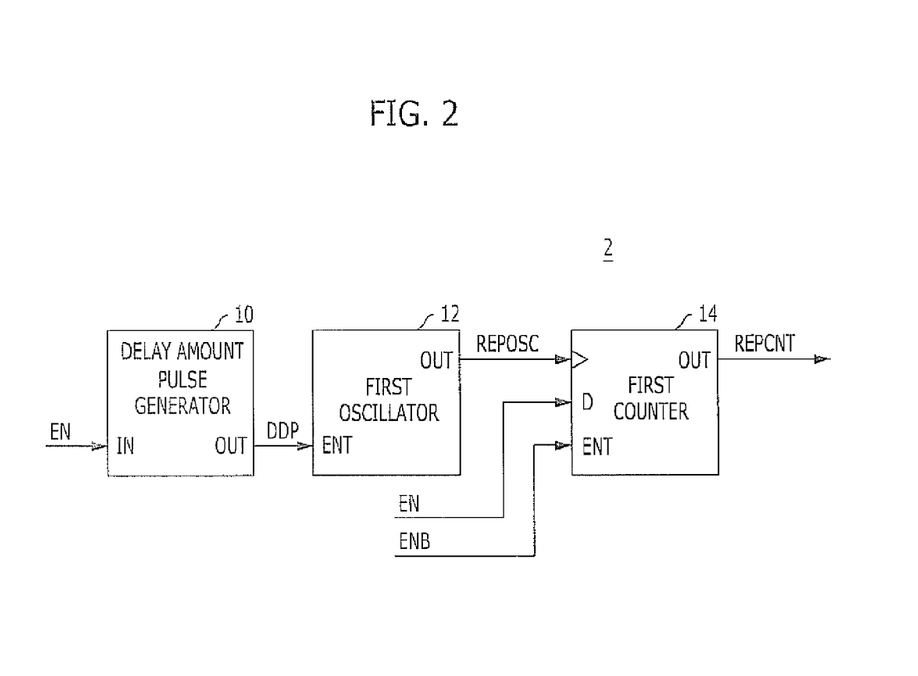
FIG. 2 is a detailed block diagram illustrating a delay amount setting unit of FIG. 1.

FIG. 2 is a detailed block diagram illustrating the delay amount setting unit 2 of FIG. 1.

Referring to FIG. 2, the delay amount setting unit 2 includes a delay amount pulse generator 10, a first oscillator 12, and a first counter 14.

The delay amount pulse generator 10 generates a delay amount pulse DDP in response to an enable signal EN. According to an example, the enable signal EN has a specific logic level (for example, a logic high level) while a power supply voltage is supplied to the semiconductor integrated circuit including the delay locked loop. According to an example, the delay amount pulse DDP maintains a specific logic level (for example, a logic high level) during a duration corresponding to a target delay amount or a target delay recovery amount from a timing (that is, a rising edge) at which the enable signal EN changes from a basic logic level (for example, a logic low level) to a specific logic level. For convenience of explanation, it is assumed that the delay amount pulse DDP generated from the delay amount pulse generator 10 includes the target delay recovery amount (that is, the half cycle (T/2) of the external clock signal—the target delay amount).

Figure 10:
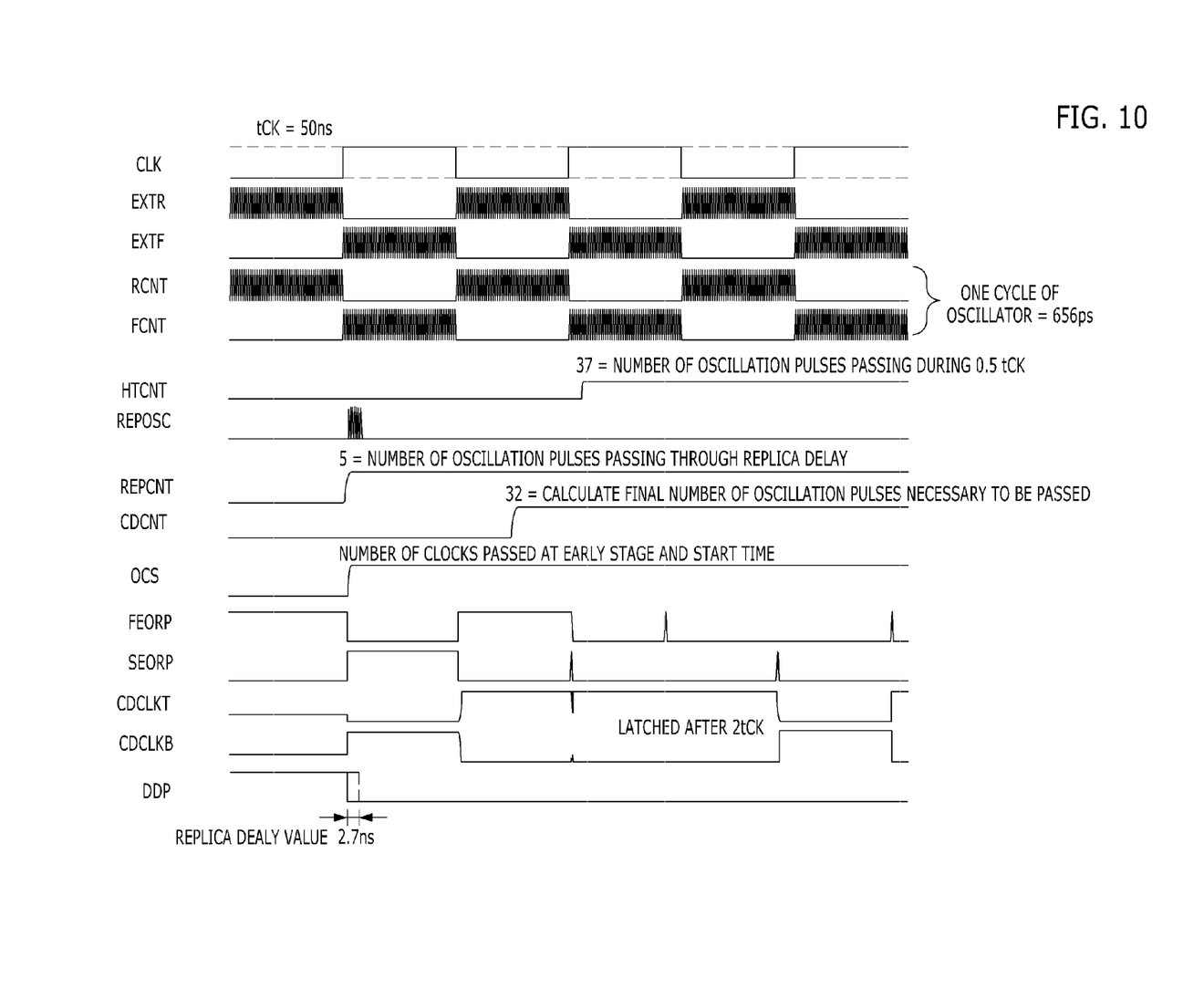
FIG. 10 is a waveform diagram explaining the operation of circuit elements illustrated in FIGS. 1 to 9.

The first oscillator 12 generates a first oscillation signal REPOSC in response to the delay amount pulse DDP generated from the delay amount pulse generator 10. As illustrated in FIG. 10, the first oscillation signal REPOSC is generated, for example, only during the duration (that is, the replica delay amount) in which the delay amount pulse DDP maintains the specific logic level (for example, the logic high level). The first oscillation signal REPOSC has a short period of a coarse unit duration corresponding to 1/2n of the cycle (T) of the external clock signal CLK. The first oscillation signal REPOSC is supplied to a clock terminal of the first counter 14.

The first counter 14 performs a count operation while an inverted enable signal ENB having the basic logic level (for example, the logic low level) is applied to a reset terminal RST thereof. According to an example, the inverted enable signal ENB maintains the basic logic level (for example, the logic low level) while a power supply voltage is supplied to the semiconductor integrated circuit including the delay locked loop. According to an example, the first counter 14 up-counts by 1 at each rising edge of the first oscillation signal REPOSC applied to a clock terminal, in response to the enable signal EN having the specific logic level (for example, the logic high level), which is applied to an input terminal D. As a result, the first counter 14 counts the number of the first oscillation signal REPOSC and generates a replica delay value REPCNT of a coarse unit duration (T/2n) as illustrated in FIG. 10. For example, it is assumed that the replica delay value REPCNT is "5" as illustrated in FIG. 10. Meanwhile, when the delay amount pulse has not the replica delay amount but the reference delay amount, the first counter 14 generates the reference delay value of the coarse unit duration (T/2n). The replica delay value REPCNT or the reference delay value generated from the first counter 14 is supplied to the coarse delay unit 4 of FIG. 1.

Figure 3:
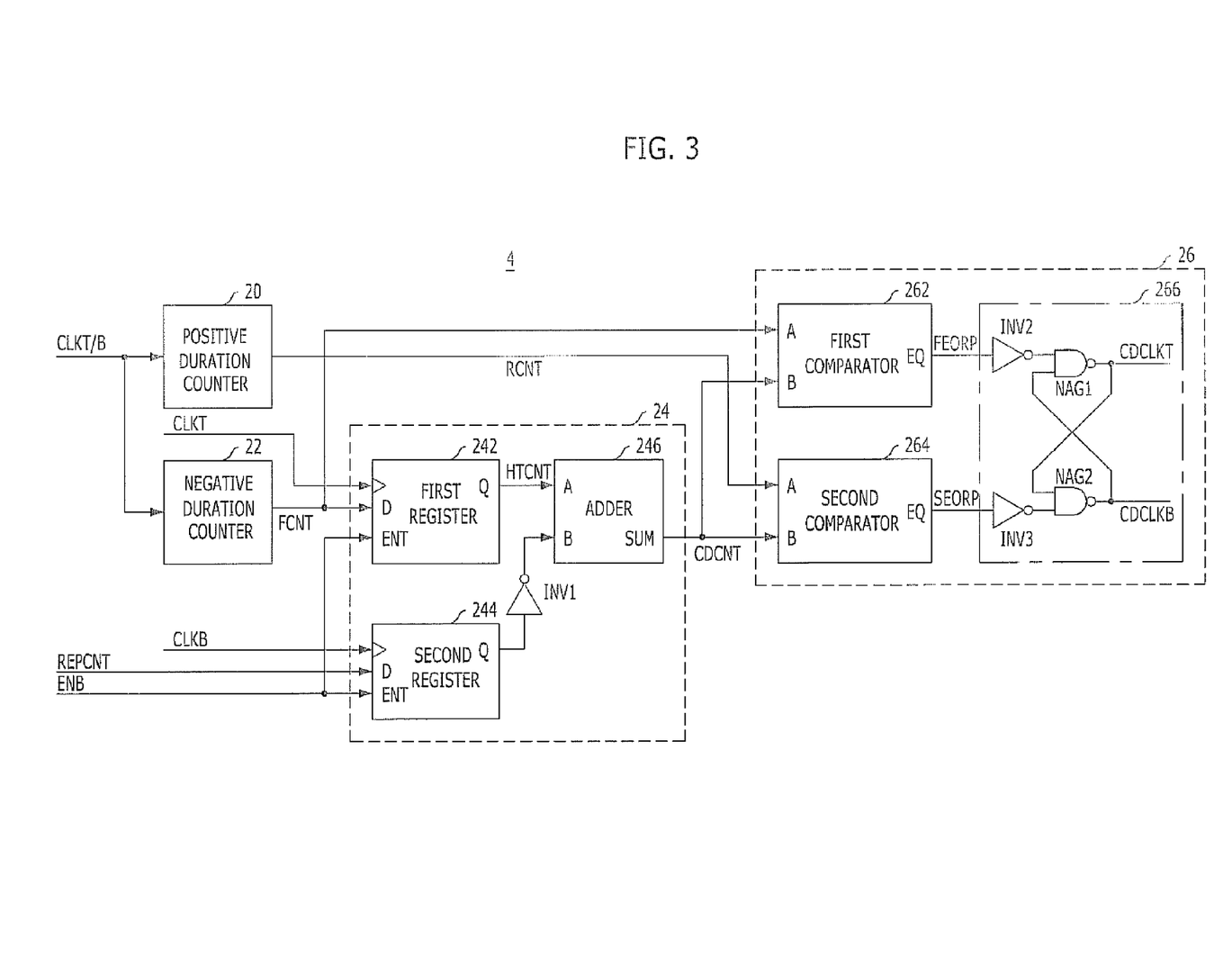
FIG. 3 is a detailed circuit diagram illustrating a coarse delay unit of FIG. 1.

FIG. 3 is a detailed circuit diagram illustrating the coarse delay unit 4 of FIG. 1.

Referring to FIG. 3, the coarse delay unit 4 includes a positive duration counter 20, a negative duration counter 22, a coarse delay value calculator 24, and a clock combiner 26.

The positive duration counter 20 counts a positive (+) duration of the external clock CLK (that is, a logic high duration or a positive phase duration), based on the coarse duration unit (that is, T/2n of the external clock signal CLK), in response to the non-inverted external clock signal CLKT and the inverted clock signal CLKB, as illustrated in FIG. 10. A positive phase duration count value RCNT is supplied to the clock combiner 26.

Likewise, the negative duration counter 22 counts a negative (−) duration of the external clock CLK (that is, a logic low duration or a negative phase duration), based on the coarse duration unit (that is, T/2n of the external clock signal CLK), in response to the non-inverted external clock signal CLKT and the inverted clock signal CLKB, as illustrated in FIG. 10. A negative phase duration count value FCNT is supplied to the clock combiner 26 and the coarse delay value calculator 24. Meanwhile, instead of the negative phase duration count value FCNT, the positive phase duration count value RCNT may be supplied to the coarse delay value calculator 24.

As illustrated in FIG. 10, the coarse delay value calculator 24 samples a half-cycle count value HTCNT from the negative phase duration count value FCNT outputted from the negative duration counter 22, and receives the replica delay value REPCNT outputted from the delay amount setting unit 2 (specifically, the first counter 14). Also, the coarse delay value calculator 24 calculates the coarse delay value CDCNT of the coarse unit duration (T/2n) from the sampled half-cycle count value HTCNT and the replica delay value REPCNT. The coarse delay value CDCNT is calculated by a difference between the half-cycle count value HTCNT and the replica delay value REPCNT, as expressed in Equation 1 below.

$$CDCNT = HTCNT - REPCNT \qquad \text{Eq. 1}$$

As an example, when assuming that the half-cycle count value HTCNT is "37", the replica delay value REPCNT is "5" and thus the coarse delay value CDCNT is "32". In order to calculate the coarse delay value CDCNT from the replica delay value REPCNT and the half-cycle count value HTCNT, the coarse delay value calculator 24 may include first and second registers 242 and 244, a first inverter INV1, and an adder 246.

The first and second registers 242 and 244 are driven while the enable signal ENB having a specific logic level is supplied to an enable terminal ENT (e.g., while a power supply voltage is supplied to the semiconductor integrated circuit).

The first register 242 samples the half-cycle count value HTCNT from the negative phase duration count value FCNT, which is supplied to an input terminal, in response to the non-inverted external clock signal CLKT. The half-cycle count value HTCNT corresponds to the negative phase duration count value at the rising edge of the non-inverted external clock signal CLKT.

Meanwhile, the second register 244 receives the replica delay value REPCNT, which is supplied from the delay amount setting unit 2 of FIG. 1 (specifically, the first counter 14 of FIG. 2) to an input terminal D thereof, at each rising edge of the inverted external clock signal CLKB, in response to the inverted external clock signal CLKB. Since the replica delay value REPCNT does not change, the second register 244 may be eliminated. In this case, the first inverter INV1 receives the replica delay value REPCNT from the first counter 14 of FIG. 2. The first inverter INV1 inverts the replica delay value REPCNT supplied from the second register 244 or the delay amount setting unit 2 of FIG. 1 (specifically, the first counter 14 of FIG. 2).

The adder 246 adds the half-cycle count value HTCNT outputted from the first register 242 and the inverted replica delay value outputted from the first inverter INV1, and calculates the coarse delay value CDCNT as illustrated in FIG. 10. The first inverter INV1 includes as many inverters as the bit number of the replica delay value REPCNT.

Meanwhile, when the delay amount setting unit 2 (specifically, the first counter 14) generates the reference delay value instead of the replica delay value REPCNT, the coarse delay value calculator 24 may obtain the coarse delay value CDCNT from the reference delay value. More specifically, the coarse delay value calculator 24 calculates the coarse delay value CDCNT by decreasing the reference delay value by "1". In this case, the coarse delay value calculator 24 includes a subtractor which receives the reference delay value and a minuend in the subtraction of "1".

The clock combiner 26 combines the non-inverted clock signal CLKT and the inverted clock signal CLKB by using the positive phase duration count value RCNT outputted from the positive duration counter 20, the negative phase duration count value FCNT outputted from the negative duration counter 22, and the coarse delay amount CDCNT outputted from the coarse delay amount calculator 24. The non-inverted clock signal and the inverted clock signal combined by the clock combiner 26 have waveforms in which the external clock signal CLK is delayed by the coarse delay value CDCNT of the coarse duration unit. In other words, the non-inverted delay clock signal CDCLKT and the inverted delay clock signal CDCLKB which are primarily delayed by "the coarse unit duration (T/2n)×(the half cycle (T/2) of the external clock signal CLK+the coarse delay value CDCNT)" are outputted from the clock combiner 26.

Here, the clock combiner 26 may include a first comparator 262, a second comparator 264, and a latch circuit 266.

The first comparator 262 has a first input terminal A receiving the negative phase duration count value FCNT from the negative duration counter 22, and a second input terminal B receiving the coarse delay value CDCNT from the adder 246 of the coarse delay value calculator 24. When the negative phase duration count value FCNT is equal to the coarse delay value CDCNT, the first comparator 262 generates a first equivalent pulse (or a positive phase start pulse) FEORP having a width of the coarse unit duration (T/2n).

Likewise, the second comparator 264 has a first input terminal A receiving the positive phase duration count value RCNT from the positive duration counter 20, and a second input terminal B receiving the coarse delay value CDCNT from the adder 246 of the coarse delay value calculator 24. When the positive phase duration count value RCNT is equal to the coarse delay value CDCNT, the second comparator 264 generates a second equivalent pulse (or a negative phase start pulse) SEORP having a width of the coarse unit duration (T/2n).

The latch circuit 266 sets an output terminal in response to the first equivalent pulse FEORP outputted from the first comparator 262, and resets the output terminal in response to the second equivalent pulse SEORP outputted from the second comparator 264. Accordingly, as illustrated in FIG. 10, the non-inverted coarse delay clock signal CDCLKT which is delayed from the non-inverted external clock signal CLKT by "the coarse unit duration (T/2n)×(the half cycle (T/2) of the external clock signal CLK+the coarse delay value CDCNT)" is generated at a non-inverting output terminal of the latch circuit 266. In other words, the non-inverted coarse delay clock signal CDCLKT whose phase leads the phase of the non-inverted external clock signal CLKT by "the replica delay amount+T/2n" is outputted at the non-inverting output terminal of the latch circuit 266. At the same time, as illustrated in FIG. 10, the inverted coarse delay clock signal CDCLKB which is delayed from the inverted external clock signal CLKB by "the coarse unit duration (T/2n)×(the half cycle (T/2) of the external clock signal CLK+the coarse delay value CDCNT)" is generated at an inverting output terminal of the latch circuit 266. In other words, the inverted coarse delay clock signal CDCLKB whose phase leads the phase of the inverted external clock signal CLKB by "the replica delay amount+T/2n" is outputted at the inverting output terminal of the latch circuit 266.

The non-inverted coarse delay clock signal CDCLKT and the inverted coarse delay clock signal CDCLKB are delay-locked with the non-inverted external clock signal CLKT and the inverted eternal clock signal CLKB within two cycles (2T) of the external clock signal. The non-inverted coarse delay clock signal CDCLKT and the inverted coarse delay clock signal CDCLKB are supplied from the latch circuit 266 to the fine delay unit 6 of FIG. 1.

The latch circuit 266 includes a second inverter INV2, a first NAND gate NAG1, a third inverter INV3, and a second NAND gate NAG2. The second inverter INV2 and the first NAND gate NAG1 are coupled in series to the output terminal EQ of the first comparator 262, and the third inverter INV3 and the second NAND gate NAG2 are coupled in series to the output terminal EQ of the second comparator 264. The first NAND gate NAG1 has a first input terminal coupled to an output terminal of the second inverter INV2, a second input terminal coupled to an output terminal of the second NAND gate NAG2, and an output terminal serving as the non-inverting output terminal. The second NAND gate NAG2 has a first input terminal coupled to an output terminal of the third inverter INV3, a second input terminal coupled to the output terminal of the first NAND gate NAG1, and an output terminal serving as the inverting output terminal.

Alternatively, the clock combiner 26 may be configured so that the first comparator 262 compares the positive phase duration count value RCNT, which is outputted from the positive duration counter 20, with the coarse delay value CDCNT, the second comparator 264 compares the negative phase duration count value FCNT, which is outputted from the negative duration counter 22, with the coarse delay value CDCNT, and the latch circuit 266 resets the output terminal in response to the first equivalent pulse FEORP outputted from the first comparator 262 and sets the output terminal in response to the second equivalent pulse SEORP outputted from the second comparator 264. In this case, as illustrated in FIG. 10, the latch circuit 266 generates the non-inverted coarse delay clock signal CDCLKT and the inverted coarse delay clock signal CDCLKB which are delayed from the non-inverted external clock signal CLKT by "the coarse unit duration (T/2n)×(the half cycle (T/2) of the external clock signal CLK+the coarse delay value CDCNT)".

Alternatively, the clock combiner 26 may output the non-inverted coarse delay clock signal CDCLKT and the inverted coarse delay clock signal CDCLKB which are primarily delayed from the external clock signal CLK within the half-cycle range of the external clock signal CLK (that is, "the coarse unit duration (T/2n)×the coarse delay value CDCNT").

Here, the clock combiner 26 is configured so that the first comparator 262 compares the positive phase duration count value RCNT, which is outputted from the positive duration counter 20, with the coarse delay value CDCNT, and the second comparator 264 compares the negative phase duration count value FCNT, which is outputted from the negative duration counter 22, with the coarse delay value CDCNT. In this case, the non-inverted coarse delay clock signal CDCLKT and the inverted coarse delay clock signal CDCLKB which are delayed from the external clock signal CLK within the half-cycle range of the external clock signal CLK (that is, "the coarse unit duration (T/2n)×the coarse delay value CDCNT") are generated at a non-inverting output terminal and an inverting output terminal of the latch circuit 266.

Alternatively, the clock combiner 26 may be configured so that the latch circuit 266 sets the output terminal in response to the first equivalent pulse FEORP outputted from the first comparator 262, and resets the output terminal in response to the second equivalent pulse SEORP outputted from the second comparator 264. In this case, the non-inverted coarse delay clock signal CDCLKT and the inverted coarse delay clock signal CDCLKB which are delayed from the external clock signal CLK within the half-cycle range of the external clock signal CLK (that is, "the coarse unit duration (T/2n)× the coarse delay value CDCNT") are generated at the non-inverting output terminal and the inverting output terminal of the latch circuit 266.

Figure 4:
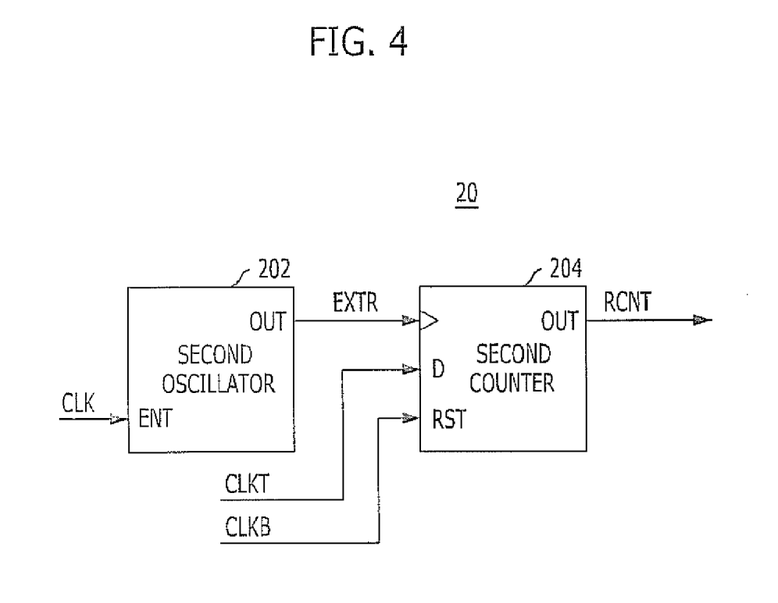
FIG. 4 is a detailed circuit diagram illustrating a positive duration counter of FIG. 3.

FIG. 4 is a detailed circuit diagram illustrating the positive duration counter 20 of FIG. 3.

Referring to FIG. 4, the positive duration counter 20 includes a second oscillator 202 and a second counter 204.

The second oscillator 202 generates a second oscillation signal EXTR at each positive phase duration (logic high duration) of the external clock signal CLK in response to the non-inverted external clock signal CLKT. As illustrated in FIG. 10, the second oscillation signal EXTR is generated at each duration (positive phase duration) during which the non-inverted external clock signal CLK maintains a specific logic level (for example, a logic high level). The second oscillation signal EXTR has a short period of a coarse unit time corresponding to 1/2n of the cycle (T) of the external clock signal CLK. The second oscillation signal EXTR is supplied to a clock terminal of the second counter 204.

The second counter 204 resets the positive phase duration count value RCNT at each negative duration (logic low duration or negative phase duration) of the external clock signal CLK in response to the inverted external clock signal CLKB supplied to a reset terminal RST. Also, the second counter 204 performs an up-counting at each positive duration (logic high duration or positive phase duration) of the external clock signal CLK in response to the non-inverted external clock signal CLKT supplied to an input terminal D.

More specifically, the second counter 204 up-counts by 1 at each rising edge of the second oscillation signal EXTR applied to a clock terminal, in response to the non-inverted external clock signal CLKT of a specific logic level (for example, a logic high level) applied to the input terminal D. As a result, the second counter 204 counts the number of the second oscillation signal EXTR and generates the positive phase duration count value RCNT which increases by 1 at each coarse unit time (T/2n) as illustrated in FIG. 10. The positive phase duration count value RCNT is supplied to the first comparator 26 of the clock combiner 26 as illustrated in FIG. 3.

Figure 5:
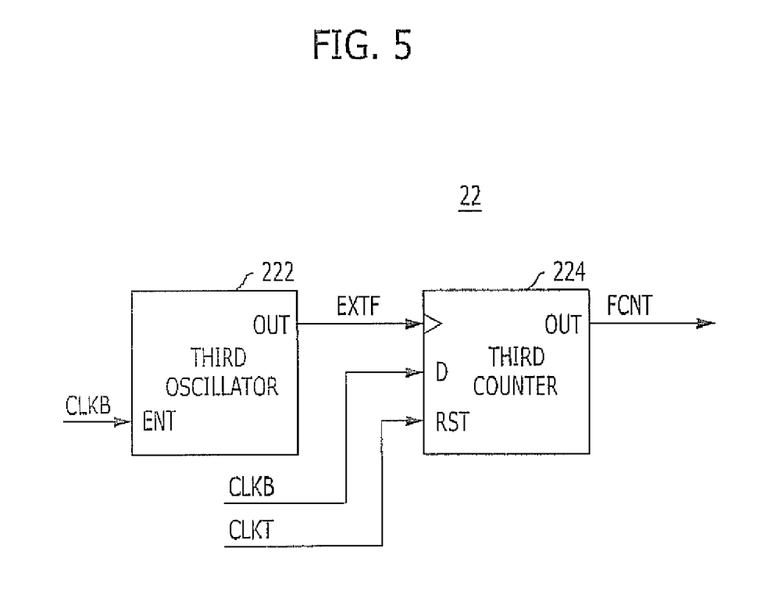
FIG. 5 is a detailed circuit diagram illustrating a negative duration counter of FIG. 3.

FIG. 5 is a detailed circuit diagram illustrating the negative duration counter 22 of FIG. 3.

Referring to FIG. 5, the negative duration counter 22 includes a third oscillator 222 and a third counter 224.

The third oscillator 222 generates a third oscillation signal EXTF at each negative duration (logic low duration or negative phase duration) of the external clock signal CLK in response to the inverted external clock signal CLKB. As illustrated in FIG. 10, the third oscillation signal EXTF is generated at each duration (negative phase duration) during which the inverted external clock signal CLKB maintains a specific logic level (for example, logic high level). The third oscillation signal EXTF has a short period of a coarse unit time corresponding to 1/2n of the cycle (T) of the external clock signal CLK. The third oscillation signal EXTF is supplied to a clock terminal of the third counter 224.

The third counter 224 resets the negative phase duration count value FCNT at each positive duration (logic high duration or positive phase duration) of the external clock signal CLK in response to the non-inverted external clock signal CLKT supplied to a reset terminal RST. Also, the third counter 224 performs an up-counting at each negative duration (logic low duration or negative phase duration) of the external clock signal CLK in response to the inverted external clock signal CLKB supplied to an input terminal D.

More specifically, the third counter 224 up-counts by 1 at each rising edge of the third oscillation signal EXTF applied to a clock terminal, in response to the inverted external clock signal CLKB of a specific logic level (for example, a logic high level) applied to the input terminal D. As a result, the third counter 224 counts the number of the third oscillation signal EXTF and generates the negative phase duration count value FCNT which increases by 1 at each coarse unit time (T/2n) as illustrated in FIG. 10. The negative phase duration count value FCNT is supplied to the first comparator 26 of the clock combiner 26 and the first register 242 of the coarse delay value calculator 24 as illustrated in FIG. 3.

Figure 6:
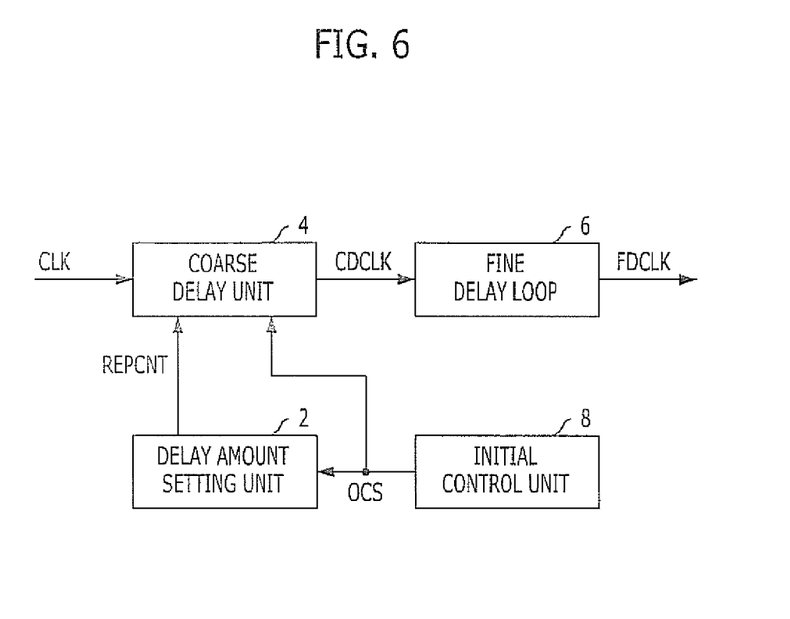
FIG. 6 is a schematic block diagram illustrating a delay locked loop in accordance with another exemplary embodiment of the present invention.

FIG. 6 is a schematic block diagram illustrating the delay locked loop in accordance with another exemplary embodiment of the present invention.

The delay locked loop of FIG. 6 has the same configuration as the delay locked loop of FIG. 1, except that an initial control unit 8 is further included. Accordingly, the same names and reference numerals are used to refer to the same elements in FIGS. 1 and 6, and detailed description about duplicate elements will be omitted.

Referring to FIG. 6, the initial control unit 8 stops the operations of the delay amount setting unit 2 and the coarse delay unit 4 during a period (kT) corresponding to a certain number (k) of external clock signals after a power supply voltage is supplied to a semiconductor integrated circuit including a delay locked loop (that is, after an enable signal EN is activated to a specific logic level (for example, a logic high level). "k" may be a natural number of at least 2. For example, when assuming that "k" is set to "7", the initial control unit 8 drives the delay amount setting unit 2 and the coarse delay unit 4 after a certain period (that is, kT=7T) from the supply of the power supply voltage. To this end, the initial control unit 8 supplies an operation control signal OCS to the delay amount setting unit 2 and the coarse delay unit 4. The operation control signal OCS maintains a basic logic level (for example, a logic low level) during a certain period (that is, kT=7T) from the supply of the power supply voltage and then is activated to a specific level (for example, a logic high level).

The delay amount setting unit 2 supplies the replica delay value REPCNT or the reference delay value to the coarse delay unit 4 after a certain period (that is, kT=7T) from the supply of the power supply voltage in response to the operation control signal OCS. The coarse delay unit 4 supplies the fine delay unit 6 with the delay clock signal CDCLK, which is delayed from the external clock signal CLK by the coarse delay value CDCNT, after a certain period (that is, kT=7T) from the supply of the power supply voltage in response to the operation control signal OCS.

Accordingly, the delay locked loop in accordance with another exemplary embodiment of the present invention can reduce a probability of an occurrence of a malfunction which may occur in a certain period from the supply of the power supply voltage. Consequently, the reliability of the delay locked loop and the semiconductor integrated circuit including the same can be improved.

Figure 7:
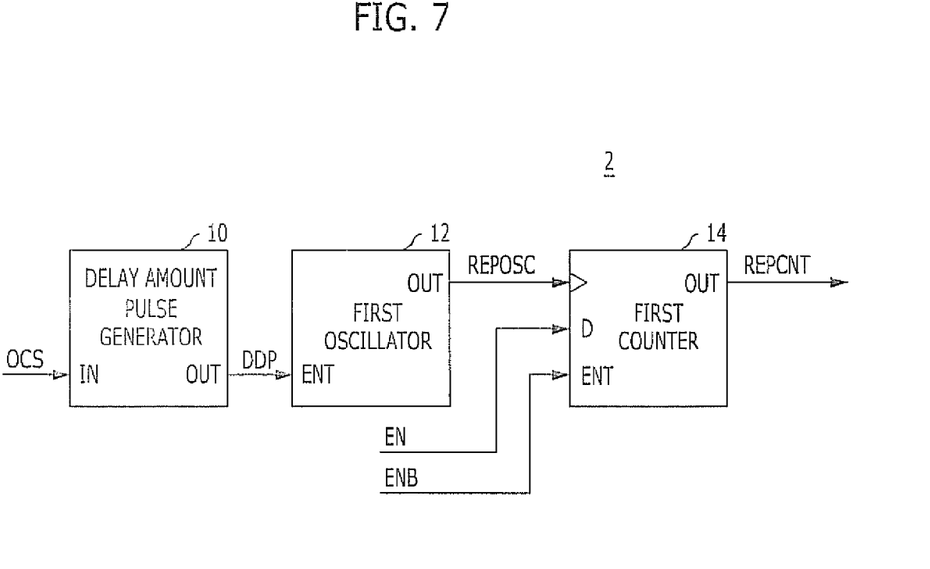
FIG. 7 is a detailed block diagram illustrating a delay amount setting unit of FIG. 6.

FIG. 7 is a detailed block diagram illustrating the delay amount setting unit 2 of FIG. 6.

The delay amount setting unit 2 of FIG. 7 has the same circuit configuration as the delay amount setting unit 2 of FIG. 2, except that, instead of the enable signal EN, the operation control signal OCS generated from the initial control unit 8 is supplied to the delay amount pulse generator 10. Accordingly, the same names and reference numerals are used to refer to the same elements in FIGS. 2 and 7, and detailed description about duplicate elements will be omitted.

The delay amount pulse generator 10 supplies the delay amount pulse to the first oscillator 12 after a certain period (that is, kT=7T) from the supply of the power supply voltage, in response to the operation control signal OCS. The first counter 14 supplies the replica delay value REPCNT to the coarse delay unit 4 after the certain period (kT) from the supply of the power supply voltage.

Figure 8:
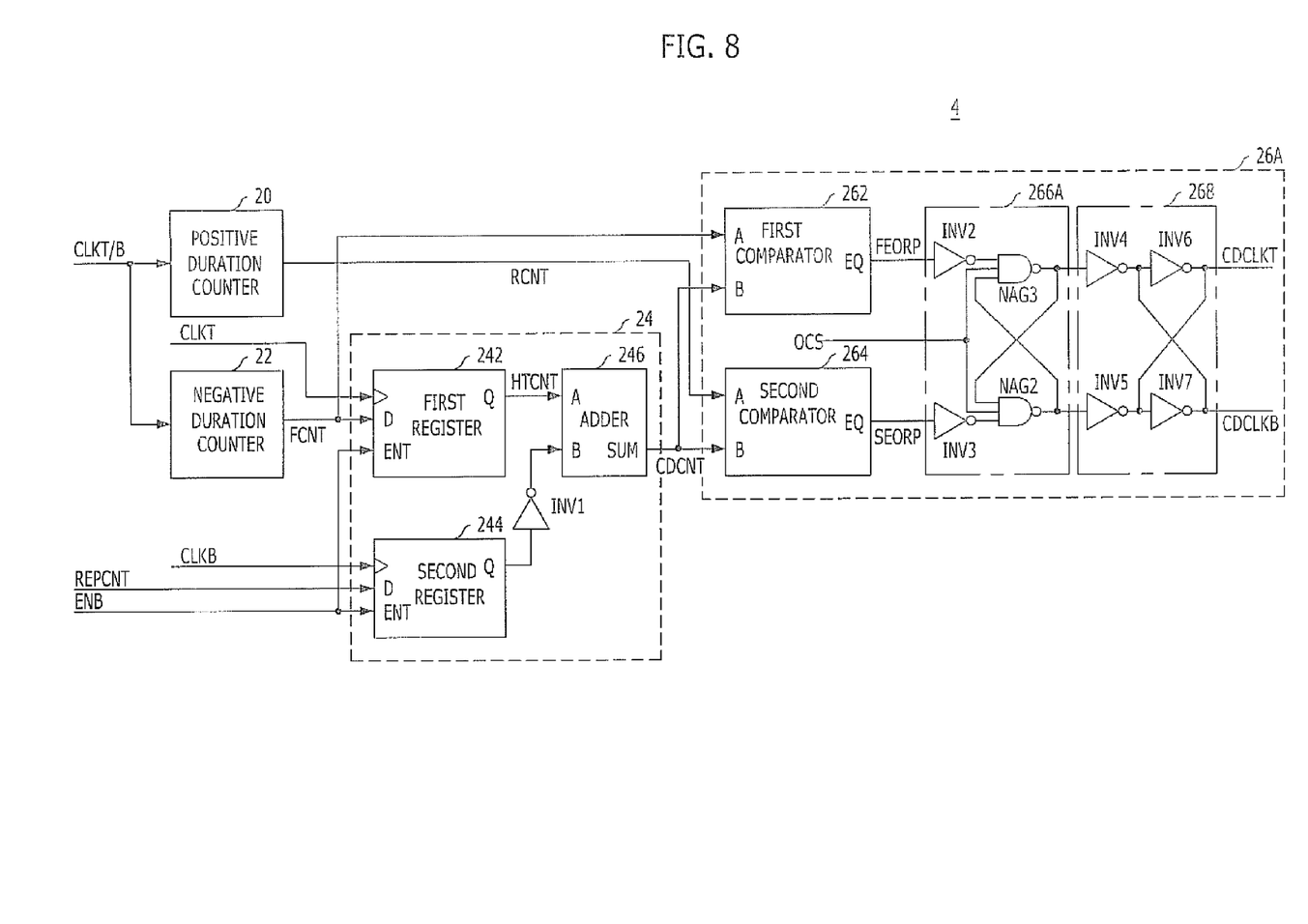
FIG. 8 is a detailed circuit diagram illustrating a coarse delay unit of FIG. 6.

FIG. 8 is a detailed circuit diagram illustrating the coarse delay unit 4 of FIG. 6.

The coarse delay unit 4 of FIG. 8 has the same configuration as the coarse delay unit 4 of FIG. 3, except that the first and second registers 242 and 244 receive the operation control signal OCS instead of the enable signal EN and the clock combiner 26 includes a control latch circuit 266A and a latch buffer 268 instead of the latch circuit 266. Accordingly, the same names and reference numerals are used to refer to the same elements in FIGS. 3 and 8, and detailed description about duplicate elements will be omitted.

The first register 242 performs a sampling operation of the half-cycle count value HTCNT after a certain period (that is, kT=7T) from the supply of the power supply voltage in response to the operation control signal OCS. Likewise, the second register 244 receives the replica delay value REPCNT after the certain period (that is, kT=7T) from the supply of the power supply voltage in response to the operation control signal OCS. Accordingly, the adder 246 supplies the coarse delay value CDCNT to the first and second comparators 262 and 264 of the clock combiner 26A after the certain period (that is, kT=7T) from the supply of the power supply voltage. Consequently, the coarse delay value calculator 24 calculates the coarse delay value CDCNT after the certain period (that is, kT=7T) from the supply of the power supply voltage.

The control latch circuit 266A performs the latch operation described with reference to FIG. 3 after the certain period (that is, kT=7T) from the supply of the power supply voltage in response to the operation control signal OCS. In other words, the control latch circuit 266A outputs the non-inverted coarse delay clock signal CDCLKT and the inverted coarse delay clock signal CDCLKB after the certain period (that is, kT=7T) from the supply of the power supply voltage.

To this end, the control latch circuit 266A includes a second inverter INV2, a third NAND gate NAG3, a third inverter INV3, and a fourth NAND gate NAG4.

The second inverter INV2 and the third NAND gate NAG3 are coupled in series to the output terminal EQ of the first comparator 262, and the third inverter INV3 and the fourth NAND gate NAG4 are coupled in series to the output terminal EQ of the second comparator 264. The third NAND gate NAG3 has a first input terminal coupled to an output terminal of the second inverter INV2, a second input terminal receiving the operation control signal OCS, a third input terminal coupled to an output terminal of the fourth NAND gate NAG4, and an output terminal serving as a non-inverting output terminal. The fourth NAND gate NAG4 has a first input terminal coupled to an output terminal of the third inverter INV3, a second input terminal receiving the operation control signal OCS, a third input terminal coupled to the output terminal of the third NAND gate NAG3, and an output terminal serving as an inverting output terminal.

The latch buffer 268 buffers the non-inverted coarse delay clock signal CDCLKT and the inverted coarse delay clock signal CDCLKB outputted from the control latch circuit 266A, and supplies the non-inverted coarse delay clock signal CDCLKT and the inverted coarse delay clock signal CDCLKB to the fine delay unit 6 of FIG. 1 without distortion.

To this end, the latch buffer 268 includes a fourth inverter INV4, a fifth inverter INV5, a sixth inverter INV6, and a seventh inverter INV7. The fourth inverter INV4 and the sixth inverter INV6 are coupled in series to the output terminal of the third NAND gate NAG3, and the fifth inverter INV5 and the seventh inverter INV7 are coupled in series to the fourth NAND gate NAG4. In addition, the sixth inverter INV6 and the seventh inverter INV7 are coupled to form a circulation loop.

Figure 9:
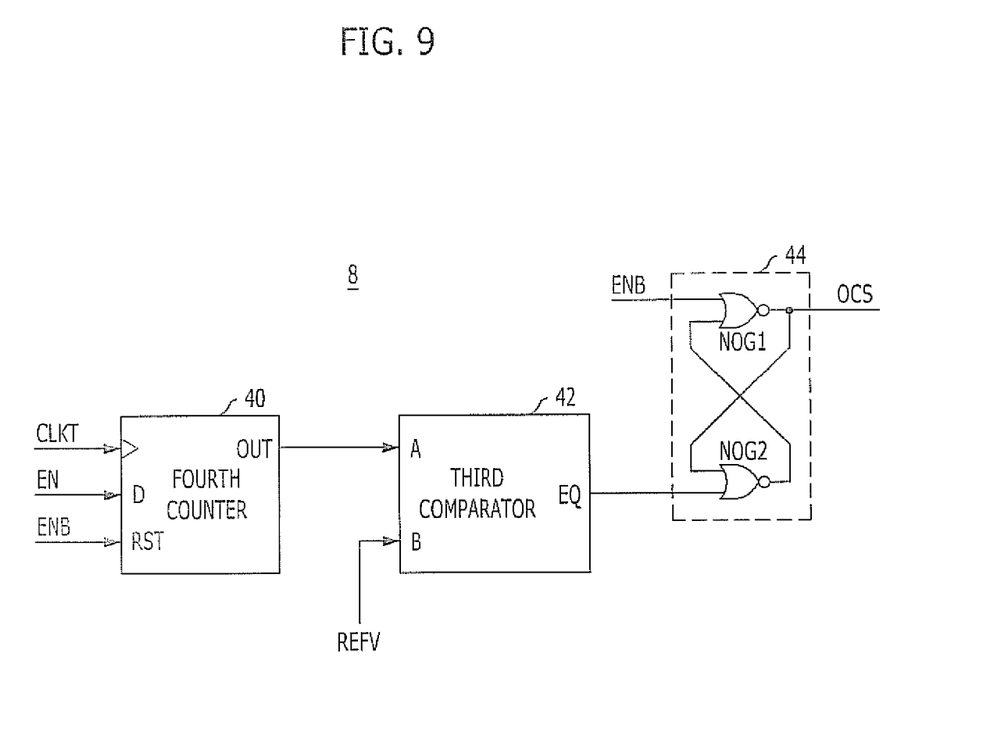
FIG. 9 is a detailed circuit diagram illustrating a reset control unit of FIG. 6.

FIG. 9 is a detailed circuit diagram illustrating the initial control unit 8 of FIG. 6.

Referring to FIG. 9, the initial control unit 8 includes a fourth counter 40, a third comparator 42, and a second latch circuit 44.

The fourth counter 40 performs a counting operation while an inverted enable signal ENB having a basic logic level (for example, a logic low level) is applied to a reset terminal RST. The inverted enable signal ENB maintains the basic logic level (for example, the logic low level) while the power supply voltage is supplied to the semiconductor integrated circuit including the delay locked loop. The fourth counter 40 up-counts by 1 at each rising edge of the inverted external clock signal CLKB applied to a clock terminal, in response to the enable signal EN of a specific level (for example, a logic high level) applied to an input terminal D. In other words, the fourth counter 40 counts the external clock signal CLK and outputs the clock count value.

The third comparator 42 has a first input terminal A receiving the clock count value outputted from the fourth counter 40, and a second input terminal B receiving a reference stabilization duration value REFV. The third comparator 42 compares the clock count value with the reference stabilization duration value and generates a third equivalent pulse. The third equivalent pulse is generated when the clock count value is equal to the reference stabilization duration value. Also, the third equivalent pulse maintains a specific logic level (for example, a logic high level) during one cycle of the external clock signal CLK.

The second latch circuit 44 has a reset terminal receiving the inverted enable signal ENB, and a set terminal coupled to the output terminal EQ of the third comparator 42. The second latch circuit 44 outputs the operation control signal CCS through an output terminal in the reference stabilization duration (kT=7T) when the power supply voltage is supplied to the semiconductor integrated circuit, in response to the inverted enable signal ENB of the basic logic level. Then, when the third equivalent pulse of the specific logic level is supplied from the third comparator 42, the second latch circuit 44 sets the operation control signal OCS of the output terminal to a specific logic level (that is, a logic high level). The operation control signal OCS generated from the second latch circuit 44 stops the operations of the delay amount setting unit 2 and the coarse delay unit 4 of FIG. 6 during a certain period from the power-on (that is, the reference stabilization duration (kT=7T). Accordingly, a probability of an occurrence of malfunction, when the power is on in the delay locked loop and the semiconductor integrated circuit including the same, decreases. Here, the second latch circuit 44 may include two NOR gates NOG1 and NOG2.

Furthermore, the initial control unit 8 may further include a second latch buffer (not shown) coupled to the second latch circuit 44. The second latch buffer buffers the operation control signal OCS outputted from the second latch circuit 44. Accordingly, due to the second latch buffer, the waveform of the operation control signal OCS outputted from the second latch circuit 44 is shaped to have a more vertical (steeper) rising edge, as illustrated in FIG. 10. The second latch buffer may include two NOR gates.

The delay locked loop in accordance with the exemplary embodiments of the present invention may extend the delay range by changing the delay amount. Therefore, the delay locked loop may be easily modified with minimizing an adding of circuit elements. Furthermore, the semiconductor integrated circuit in accordance with the exemplary embodiments of the present invention may easily synchronize the external clock signal and the operation clock of the logic circuit, which have a large phase difference.

While the present invention has been described with respect to the specific embodiments, it will be apparent to those skilled in the art that various changes and modifications may be made without departing from the spirit and scope of the invention as defined in the following claims.

What is claimed is:

1. A delay locked loop comprising:
   a delay amount setting unit configured to set a delay amount of an external clock signal;
   a coarse delay unit configured to primarily delay the external clock signal by the set delay amount based on a first unit duration which is a unit delay amount of the coarse delay unit; and
   a fine delay unit configured to secondarily finely delay the primarily delayed clock signal based on a second unit duration, which is a unit delay amount of the fine delay unit and smaller than the first unit duration,
   wherein the first unit duration is set to correspond to 1/n of a cycle of the external clock signal, and the second unit duration is set to correspond to 1/m of the first unit duration, each of n and m being a natural number.

2. The delay locked loop of claim 1, wherein the set delay amount is set to be larger than a target delay amount, which is a total delay amount of the coarse delay unit and the fine delay unit, and less than the sum of the target delay amount and the first unit duration.

3. The delay locked loop of claim 2, wherein the set delay amount is set to a multiple of the first unit duration.

4. The delay locked loop of claim 3, wherein the delay amount setting unit comprises:
   a pulse generator configured to generate a delay amount setting pulse having a width corresponding to the target delay amount;
   a first oscillator configured to generate an oscillation signal having a period of the first unit duration in response to the delay amount setting pulse; and
   a first counter configured to count the oscillation signal outputted from the first oscillator and provide the set delay amount.

5. The delay locked loop of claim 1, wherein the set delay amount is set in a form of a replica delay amount.

6. The delay locked loop of claim 5, wherein the replica delay amount is set to be larger than a target delay recovery amount, which is a period corresponding to a cycle of the external clock signal subtracted by a target delay amount, and less than a sum of the target replica delay amount and the first unit duration, wherein the target delay amount is a total delay amount of the coarse delay unit and the fine delay unit.

7. The delay locked loop of claim 6, wherein the delay amount setting unit comprises:
a pulse generator configured to generate a replica delay amount setting pulse having a width corresponding to the replica delay amount;
a first oscillator configured to generate an oscillation signal having a period of the first unit duration in response to the replica delay amount setting pulse; and
a first counter configured to count the oscillation signal outputted from the first oscillator and provide the replica delay amount to the coarse delay unit.

8. The delay locked loop of claim 6, wherein the coarse delay unit comprises:
a positive duration counter configured to count a number of the first unit durations in a positive phase duration of the external clock signal;
a negative duration counter configured to count the number of the first unit durations in a negative phase duration of the external clock signal;
a coarse delay amount calculator configured to calculate a coarse delay amount using the coarse delay amount and one of a positive phase duration count value of the positive duration counter and a negative phase duration count value of the negative duration counter; and
a clock combiner configured to generate a primary delay clock signal according to a positive phase duration count value, a negative phase duration count value, and the coarse delay amount, and provide the primary delay clock signal to the fine delay unit.

9. The delay locked loop of claim 8, wherein the positive duration counter comprises:
a second oscillator configured to generate a second oscillation signal having a period of the first unit duration in the positive phase duration in response to the external clock signal; and
a second counter configured to count the number of the second oscillation signal generated in the positive phase duration of the external clock signal, and generate the positive phase duration count value.

10. The delay locked loop of claim 8, wherein the negative duration counter comprises:
a third oscillator configured to generate a third oscillation signal having a period of the first unit duration in the negative phase duration in response to the external clock signal; and
a third counter configured to count the number of the third oscillation signal generated in the negative phase duration in response to the external clock signal, and generate the negative phase duration count value.

11. The delay locked loop of claim 8, wherein the coarse delay amount calculator comprises:
a half-cycle detector configured to sample a half-cycle count value of the external clock signal from one of the positive phase duration count value and the negative phase duration count value; and
an operator configured to obtain the coarse delay amount from the half-cycle count value and the replica delay amount.

12. The delay locked loop of claim 11, wherein the replica delay amount has a value less than the half cycle of the external clock signal, the operator is configured to calculate the coarse delay amount by subtracting the replica delay amount from the half-cycle count value.

13. The delay locked loop of claim 12, wherein the clock combiner comprises:

a first comparator configured to compare the positive phase duration count value with the coarse delay amount, and generate a positive phase start impulse;
a second comparator configured to compare the negative phase duration count value with the coarse delay amount, and generate a negative phase start impulse; and
a first latch circuit configured to be set and reset by the positive phase start impulse and the negative phase start impulse and, generate the primary delay clock signal which is delayed by the coarse delay amount.

14. The delay locked loop of claim 12, wherein the clock combiner comprises:
a first comparator configured to compare the positive phase duration count value with the coarse delay amount, and generate a positive phase start impulse;
a second comparator configured to compare the negative phase duration count value with the coarse delay amount, and generate a negative phase start impulse; and
a first latch circuit configured to be set by the positive phase start impulse, reset by the negative phase start impulse, and generate the primary delay clock signal which is delayed by the coarse delay amount.

15. The delay locked loop of claim 12, wherein the clock combiner comprises:
a first comparator configured to compare the positive phase duration count value with the coarse delay amount, and generate a positive phase start impulse;
a second comparator configured to compare the negative phase duration count value with the coarse delay amount, and generate a negative phase start impulse; and
a first latch circuit configured to be reset by the positive phase start impulse, set by the negative phase start impulse, and generate the primary delay clock signal which is delayed by the sum of the half cycle of the external clock signal and the coarse delay amount.

16. The delay locked loop of claim 12, wherein the clock combiner comprises:
a first comparator configured to compare the negative phase duration count value with the coarse delay amount, and generate a positive phase start impulse;
a second comparator configured to compare the positive phase duration count value with the coarse delay amount, and generate a negative phase start impulse; and
a first latch circuit configured to be set by the positive phase start impulse, reset by the negative phase start impulse, and generate the primary delay clock signal which is delayed by the sum of the half cycle of the external clock signal and the coarse delay amount.

17. The delay locked loop of claim 12, wherein the clock combiner comprises:
a first comparator configured to compare the negative phase duration count value with the coarse delay amount, and generate a positive phase start impulse;
a second comparator configured to compare the positive phase duration count value with the coarse delay amount, and generate a negative phase start impulse; and
a first latch circuit configured to be reset by the positive phase start impulse, set by the negative phase start impulse, and generate the primary delay clock signal which is delayed by the coarse delay amount.

18. The delay locked loop of claim 8, wherein the clock combiner comprises:

a first comparator configured to compare the coarse delay amount with one of the positive phase duration count value and the negative phase duration count value, and generate a positive phase start impulse;

a second comparator configured to compare the coarse delay amount with the other of the positive phase duration count value and the negative phase duration count value, and generate a negative phase start impulse; and a first latch circuit configured to be set and reset in response to the positive phase start impulse and the negative phase start impulse, and generate the primary delay clock signal.

19. The delay locked loop of claim 18, wherein the clock combiner further comprises a buffer configured to buffer the primary delay clock signal outputted from the first latch circuit.

20. The delay locked loop of claim 1, further comprising a reset control unit configured to limit the operations of delay amount setting unit and the coarse delay unit during at least two periods of the external clock signal when the coarse delay unit and the fine delay unit are driven.

* * * * *